US009122834B1

(12) United States Patent
Caluya et al.

(10) Patent No.: US 9,122,834 B1
(45) Date of Patent: Sep. 1, 2015

(54) METHOD OF USING CONTINUOUS PARAMETER VALUE UPDATES TO REALIZE RAPID PCELL EVALUATION

(71) Applicant: Cadence Design Systems, Inc., San Jose, CA (US)

(72) Inventors: Serena Chiang Caluya, Pleasanton, CA (US); Li-Chien Ting, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/088,205

(22) Filed: Nov. 22, 2013

(51) Int. Cl.
*G06F 17/50* (2006.01)
(52) U.S. Cl.
CPC ................... *G06F 17/5081* (2013.01)
(58) Field of Classification Search
USPC ......... 716/101–102, 104, 106–108, 110–113, 716/132–135
See application file for complete search history.

(56) References Cited

U.S. PATENT DOCUMENTS

| 7,761,829 | B1* | 7/2010 | Jayachandran et al. ...... 716/130 |
| 8,028,265 | B2* | 9/2011 | Ramsour et al. ............. 716/122 |
| 8,028,266 | B2* | 9/2011 | Ramsour et al. ............. 716/122 |
| 8,707,226 | B2* | 4/2014 | Lu et al. ...................... 716/104 |
| 8,726,209 | B1* | 5/2014 | Lamant et al. ............... 716/111 |

\* cited by examiner

*Primary Examiner* — Nghia Doan
(74) *Attorney, Agent, or Firm* — Kenyon & Kenyon LLP (57) ABSTRACT

A system, method, and computer program product for using continuous parameter value updates to rapidly evaluate parameterized cells in a design tool. Embodiments display parameters and corresponding parameter values of parameterized cells in a circuit design in a GUI, adjust parameter values according to user input, evaluate the parameterized cell, and present results of the evaluating in the GUI during the displaying. Parameters influence circuit layout, circuit schematics, or simulation settings. Parameter values include current, minimum, maximum, and increment values. Parameterized cells may be individual cell instances, submaster cells, or master cells. Embodiments integrate validation tools and detect design rule check violations, assertion violations, invalid parameter values, and evaluation errors, and responsively generate user error alerts and selectively disallow further adjusting. Embodiments generate test circuits, each using a parameter value from a permutation of the adjusted parameter values.

20 Claims, 10 Drawing Sheets

NGATES=1
GATE_WIDTH=W1
GATE_LENGTH=L1

FIG. 2B

NGATES=1
GATE_WIDTH=W2
GATE_LENGTH=L2

FIG. 2C

NGATES=2
GATE_WIDTH=W3
GATE_LENGTH=L3

METHOD OF USING CONTINUOUS PARAMETER VALUE UPDATES TO REALIZE RAPID PCELL EVALUATION

BACKGROUND

This patent application relates to the field of circuit simulation, and more precisely to enabling circuit designers to more easily and immediately visualize the effects of parameter changes on parameterized cells.

Circuit designers often use parameterized cells or "Pcells" to efficiently create a circuit design. A Pcell is defined in this application as a parameterized and programmable cell that allows a user to dynamically create a customized circuit design according to a set of specified Pcell parameters. A Pcell thus represents a part of a circuit that is not a fixed element. The term "Pcell" also encompasses other descriptors that may be used by a variety of commercial circuit design tool vendors for their various implementations of parameterized and programmable cells.

A given Pcell may be instantiated in a design many times, sometimes as part of a hierarchical design process used to help manage design complexity and to increase designer productivity. Different instances may have different parameter values. Customized circuit designs may thus be created simply by providing different Pcell parameter values in different cell instances. For example, a designer may create a transistor cell and then use different instances of the same cell with different specified widths, lengths, and other governing parameters to create different transistors. Pcells are often implemented in source code, and commercially offered software programs are available from different vendors for executing this source code.

The instantiation of a Pcell may cause the addition of program-created circuitry to a circuit schematic, and/or trigger the construction of a corresponding layout geometry that will be used to control its manufacture. Parameter values may therefore influence the electrical behavior of the circuit as well as its layout.

Once the layout of a circuit is finished, it is checked to make sure it satisfies the design rules, which are typically provided by an integrated circuit foundry. Design rules describe minimum distances, sizes, enclosure criteria, and other constraints for implementing the layout properly. Design rules are not specific for any particular integrated circuit, but are instead applied to all designs to be processed using a particular process technology. In modern submicron integrated circuitry, the electrical behavior and physical layout of circuits can be tightly interrelated. As a result, the design rules governing integrated circuit structures are often complex. Commercial software programs are therefore available to perform design rule checking Layout changes may be required for all design rule checks to be met.

While parameterized programmable cell-based designs are powerful when properly managed, with conventional software tools Pcell-based designs may only be edited via their parameters. As a result, circuit designers cannot necessarily quickly and easily see and conceptually correlate the results of parameter value changes on Pcells. A clear intuitive design relationship between parameter changes and circuit behavior and layout geometry is often lacking.

Also, Pcell tools do not always check parameter value validity, nor do the tools accept the setting of ranges of parameter values. A user may therefore provide an unrealistic value for a parameter but no immediate invalidation for it occurs. Design problems may therefore persist for some time until the root of the problem is discerned.

Finally, when a user is testing different parameter values, focus is constantly switching between the parameter editing form and the graphic display window depicting layout results. This loss of focus makes it difficult for the user to recognize what has changed in the Pcell design being displayed. Accordingly, the inventors have developed a novel way to use continuous parameter value updates to rapidly evaluate a programmable cell.

DETAILED DESCRIPTION

This patent application presents a new system, method, and computer program product for using continuous parameter value updates to rapidly evaluate parameterized cells. Embodiments provide a design environment that enables the user to continuously update a parameter value, provide the updated parameter value to the Pcell evaluator engine, and graphically display the result nearly simultaneously. The continuous updating may be provided by a user rolling mouse wheel, for example. A user may therefore see how the Pcell changes continuously with increasing or decreasing parameter values, without losing visual focus.

Figure 1:
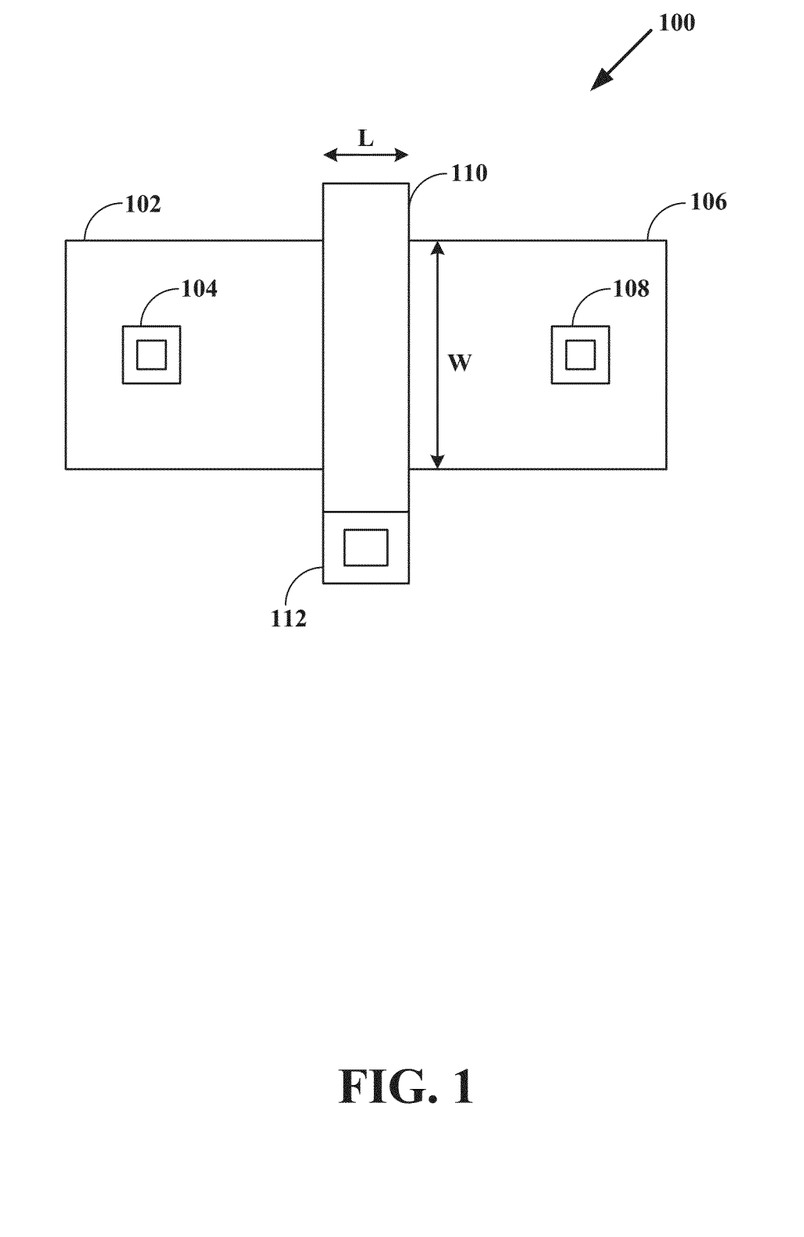
FIG. 1 is a diagram of a general transistor Pcell instance, according to an embodiment.

FIG. 1 shows a general transistor Pcell instance, according to an embodiment. Here a typical self-aligned MOSFET device 100 layout is shown in a top view, with a source 102, a source contact 104, a drain 106, a drain contact 108, a gate 110, and a gate contact 112. Exemplary parameters shown here may include a gate width GATE_WIDTH, a gate length GATE_LENGTH, and number of gates N_GATES. Other parameters not shown may specify details of which material layers are used for constructing the various portions, contact sizes and spacings, and other layout related constraints, as will be familiar to those of ordinary skill in the art of circuit design.

The Pcell instance in this embodiment generates a layout geometry when its source code is executed. Pcell instances may also connect a generated device to a circuit schematic, as is known in the art. Pcell source code may be written in the SKILL or Python languages, for example, or in any other language, such as Tcl, that may be used by various commercial design tool vendors for implementing parameterized and programmable cells. The Pcell definition may also include assertions that may be validated when the source code is executed. Violations of assertions may trigger error signals.

In this embodiment, each parameter shown may have a default value, a minimum value, a maximum value, and an increment value describing how each parameter value may be stepped. For example, N_GATES may default to one, and have a minimum value of one, a maximum value of three, and an increment value of one, meaning that integral values of one, two, and three may be allowed. Geometry-related parameters like GATE_WIDTH may be more continuous variables, perhaps ranging from a minimum value of 0.1 microns to 1.0 microns, with optional incremental values of 0.05 microns for example. A user may specify incremental values directly, or they may be computed from the minimum value and maximum value to provide a predetermined or user-selectable number of steps in between.

Figure 2A:
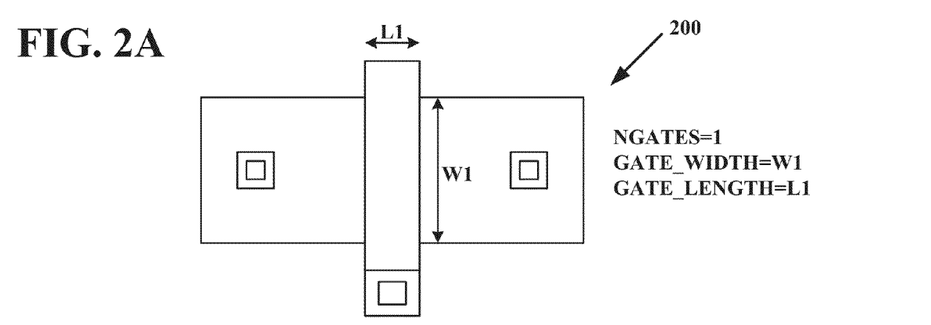
FIGS. 2A-2C are diagrams of specific transistor Pcell instances, according to an embodiment.
Figure 2B:
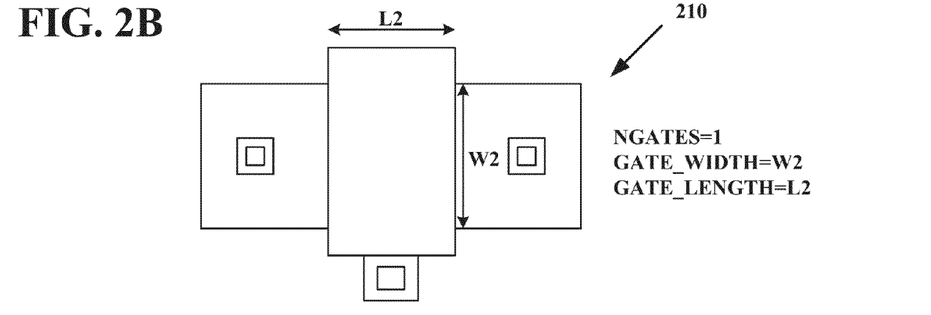
Figure 2C:
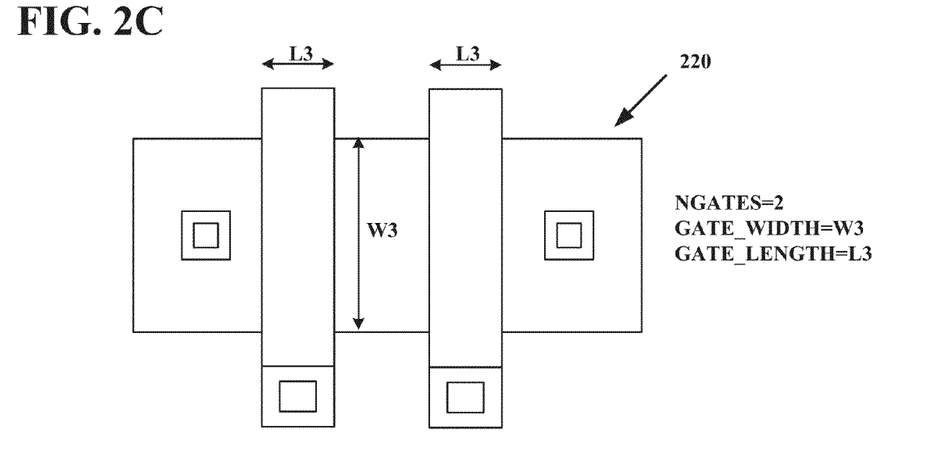

FIGS. 2A-2C show specific transistor Pcell instances 200, 210, and 220, according to an embodiment. Each figure is again a top view of a generated MOSFET layout geometry. For each instance, parameter values such as N_GATES, GATE_WIDTH, and GATE_LENGTH may be input, and the Pcell source code may generate the layout geometries when executed. The parameter values may produce noticeable differences in individual instance layouts as shown.

Embodiments of the present invention provide a scoping mechanism to control ranges of parameter values. A user may set each parameter's minimum value, maximum value, and increment value (i.e., step size), to provide better control over a Pcell. The particular value or set of values may be back annotated to the Pcell source code for use during Pcell evaluation. Increment values may be large initially, but embodiments enable a user to choose smaller increments for more precise parameter value adjustments.

Figure 3:
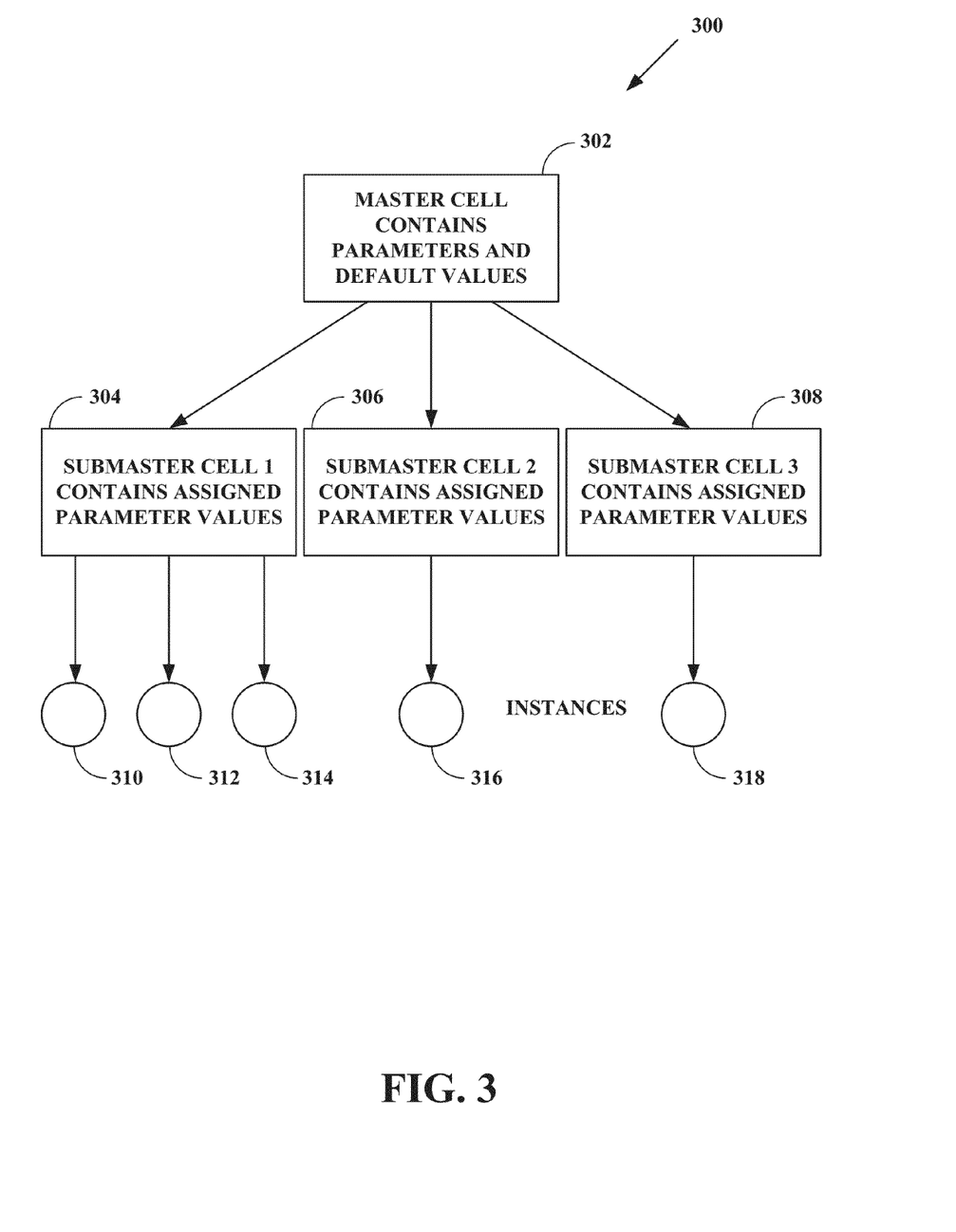
FIG. 3 is a diagram of a Pcell hierarchy, according to an embodiment.

FIG. 3 shows a Pcell hierarchy 300, according to an embodiment. Pcell hierarchies may speed up the design process by eliminating the need to manually create duplicate versions of the same functional part represented by individual instances. Instead, instances may be created from master cells and submaster cells; submaster cells need only be created if there is a need to override inherited master cell parameter values. Further, storage space is reduced by having a hierarchical design unfold when opened by a design tool. The design tool needs only to maintain the master cell and any overriding parameter values, so there is less chance for errors to be introduced. Finally, there is no need to expand all levels of a hierarchy when a designer wants to change a detail of a design.

Master cell 302 may contain parameters and default parameter values describing a portion of a circuit design, and may be stored in a design file. A number of submaster cells 304, 306, and 308, may be generated from master cell 302 when a design is opened, and may be stored in memory during operation of a design program. Each submaster cell may contain a number of assigned parameter values that override the parameter values that would otherwise be inherited from master cell 302. Instances 310-318 are individual copies of Pcells that in turn acquire parameter values from respective submaster cells. Some design tools allow users to define only master cells, while others enable more user control over submaster cells and individual instances. In this application, operation on only one Pcell instance is described for clarity, but the invention is not limited to such exemplary embodiments.

Figure 4A:
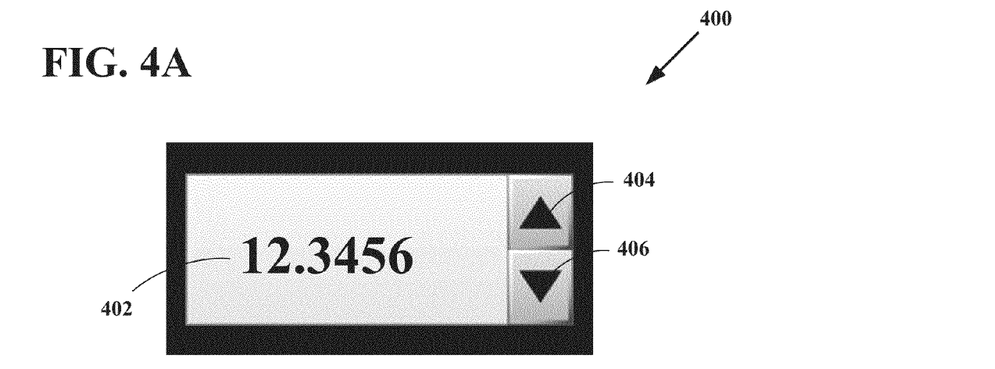
FIGS. 4A-4B are diagrams of graphical user interface (GUI) widgets, according to an embodiment.
Figure 4B:
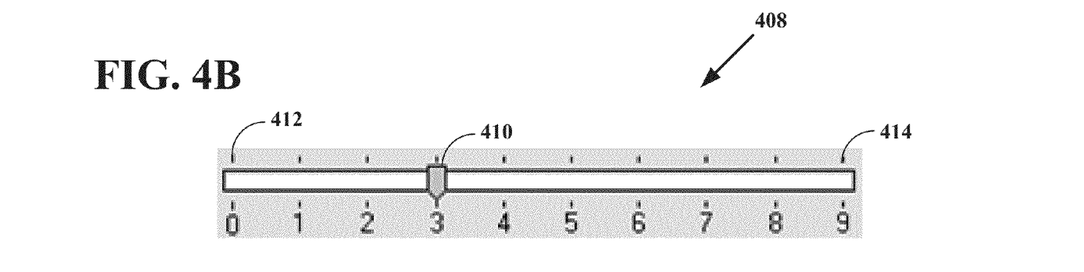

FIGS. 4A-4B show graphical user interface widgets, according to an embodiment. In computer programming, a GUI widget is an element that displays an information arrangement that may be modified by the user. Widgets provide a single interaction point for the direct manipulation of a given kind of data. A user may thus select and update each Pcell parameter through a GUI widget that supports continuous setting of a parameter value. For each parameter value update, embodiments may re-evaluate the selected Pcell instance, and display the result, as will be described. Therefore, by changing the parameter value continuously, a user may see the Pcell continuously transformed.

Spin box 400 is a widely used widget that provides a text box 402 for direct entry of a value, as well as an up arrow 404 and a down arrow 406 that may be activated by a user. In this embodiment, a parameter value may be entered directly in spin box 400, and the up and down arrows allow a user to indicate that a parameter value is to be incremented or decremented, respectively.

The user may indicate a desire to increment or decrement in a number of ways, including pressing an appropriate arrow button using a display cursor, selecting the spin box and then hitting a keyboard up arrow or down arrow key, or by rolling a mouse scrolling wheel in a given direction, for example. The parameter value may thus be increased or decreased continuously as desired, or in discrete steps by using the optional increment value if available. Spin boxes are useful when users do not necessarily need to see the entire range of possible values to make a selection.

Slider 408 is another widely used GUI widget that depicts a number or range of possible parameter values, usually arranged in a line, that are available for selection by a user, and an indicator 410 denoting a current parameter value. In this example, indicator 410 depicts a current parameter value of three. The user may set a parameter by moving the indicator. In some cases, the user may also click on a particular point on the slider to change the current parameter value accordingly.

The minimum parameter value 412 and the maximum parameter value 414 may be directly denoted on slider 408 as shown (e.g., zero and nine, respectively). Increment values between the minimum parameter value 412 and the maximum parameter value 414 may also be shown; in this instance the increment value is one. If no increment value has been specified, the parameter value may be continuously varied. Although shown as a horizontal line, slider 408 may also be vertically oriented in the graphical user interface.

Numerous widgets may be provided in a GUI to enable a user to simultaneously view and adjust multiple parameter values. Many other user interface devices may be used to gather user input, including touch-based input systems such as track pads and touch-sensitive display screens. In such systems, a stylus or user's fingertip contact point may replace a display cursor, and various sensors may determine the changes in contact point position to determine equivalent cursor movements or otherwise interpret user commands.

Figure 5:
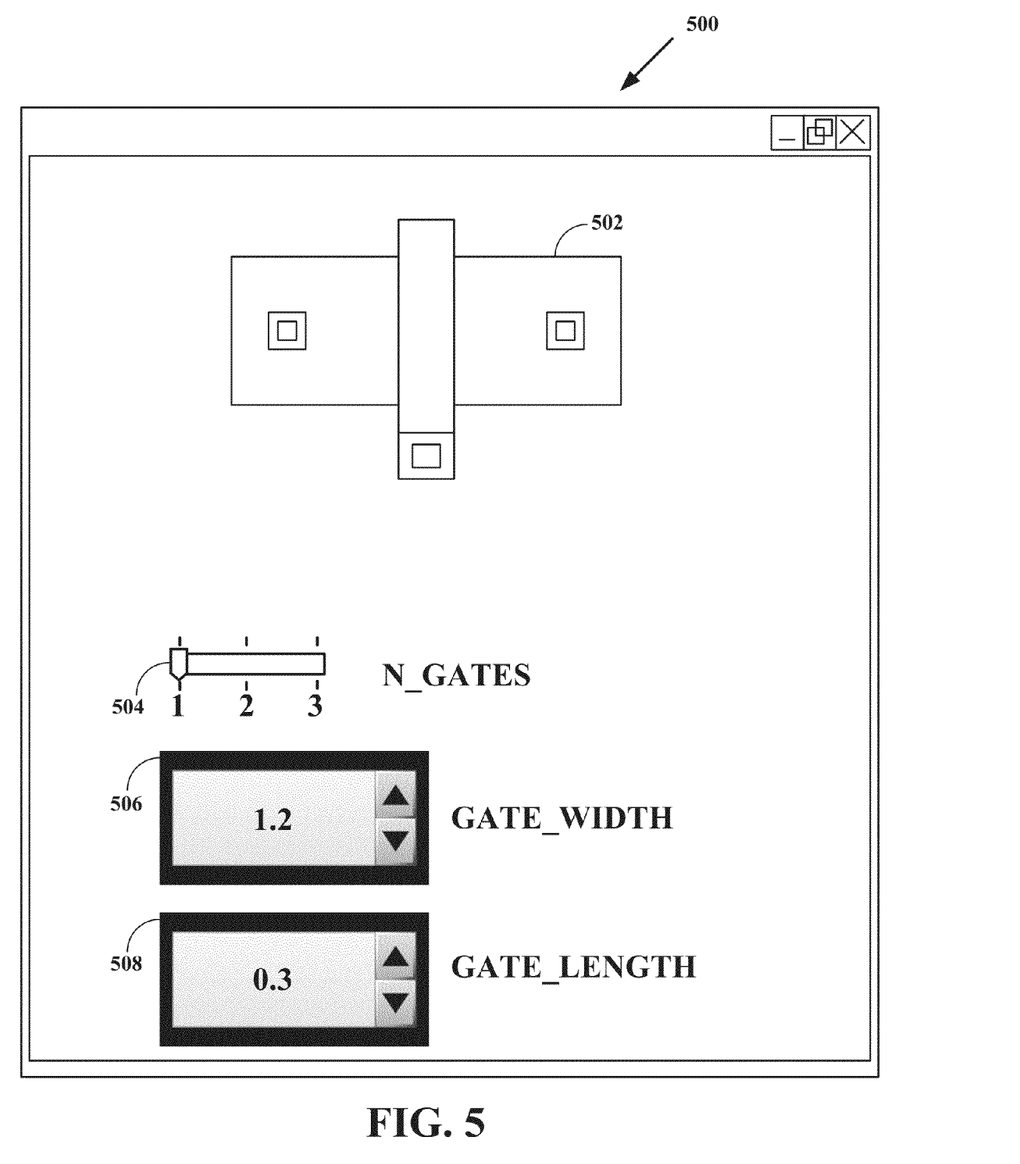
FIG. 5 is a diagram of a unified graphical user interface, according to an embodiment.

FIG. 5 shows a unified graphical user interface 500, according to an embodiment. The unified GUI 500 contains the Pcell information along with its parameters, and thus serves as a command tool that allows a user to rapidly see Pcell evaluation results for different input parameter sets. The unified GUI displays at least one user input widget to communicate and control a parameter value while simultaneously depicting the generated Pcell.

In this example, the MOSFET layout 502 is automatically generated by evaluation of a Pcell having parameters N_GATES, GATE_WIDTH, and GATE_LENGTH as before. Slider 504 controls parameter N_GATES, while spin box 506 controls parameter GATE_WIDTH and spin box 508 controls parameter GATE_LENGTH.

This design environment significantly improves a user's experience with the updating of Pcell parameter values. The previous manual iterations of entering one value, applying the update, and later separately examining the results may be replaced by a single unified GUI that immediately visually depicts the evaluated results along with the input information. The parameter values being adjusted may also be displayed simultaneously, so a single view provides a circuit designer with all the relevant information regarding the design. Although in this example the unified GUI 500 is layout-oriented, other embodiments may similarly allow a user to easily see and control circuit schematics and simulator settings, as well as the evaluation results. Thus, numerous improvements may be provided to shorten the circuit design and validation processes.

Figure 6:
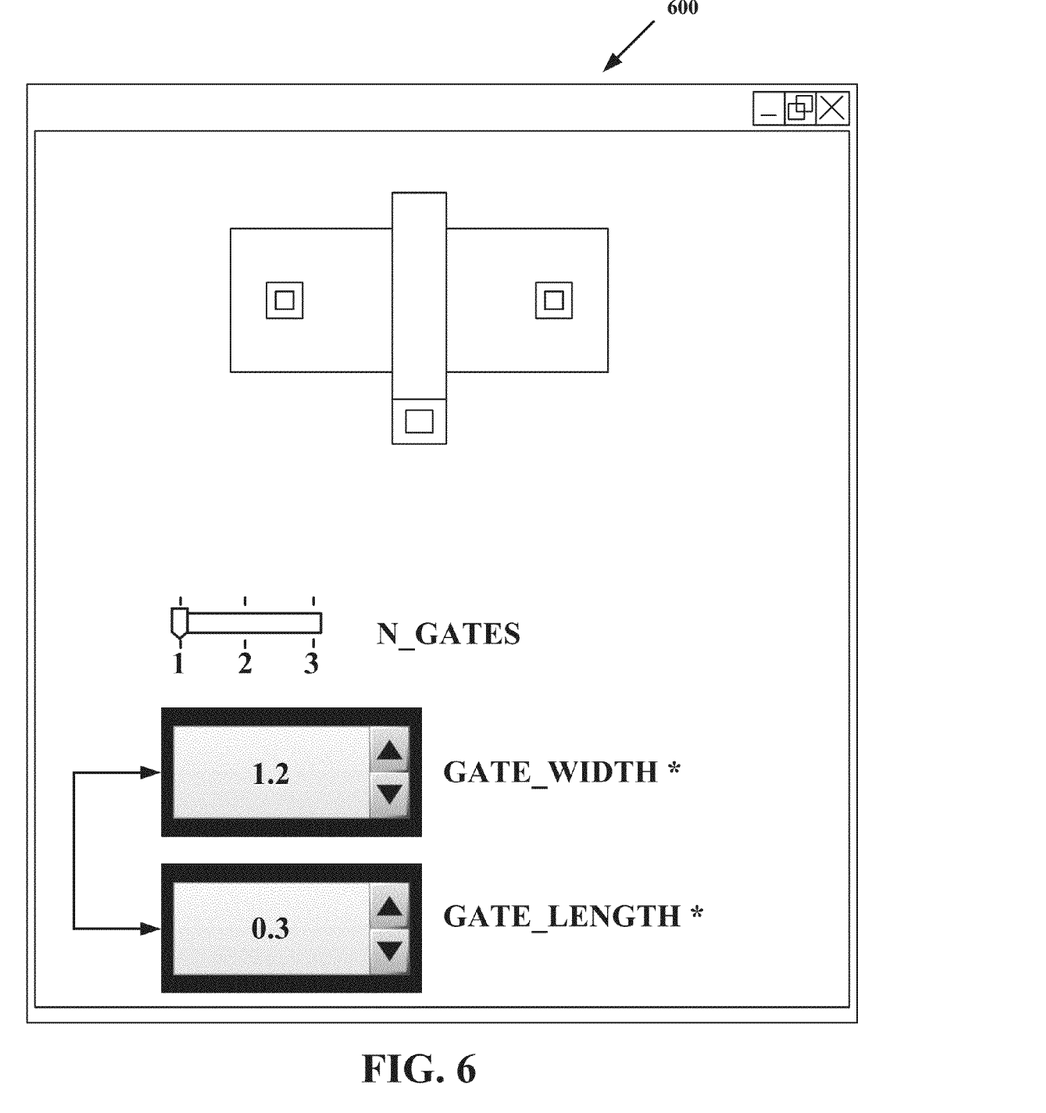
FIG. 6 is a diagram of a unified graphical user interface with grouped parameters, according to an embodiment.

FIG. 6 shows a unified graphical user interface 600 with grouped parameters, according to an embodiment. Grouping parameters together for value updating may allow a user to quickly observe results that are difficult to run manually. In this example, parameters GATE_WIDTH and GATE_LENGTH are selected to vary together as a group, so that as one increases by its defined increment value the other also increases by its defined increment value. In another embodiment, all grouped parameters may be changed in value by a specified percentage. In another embodiment, some parameters may be designated to have an inverse behavior, so that such parameters change in value in the opposite direction to the selected group parameter values. A variety of indicia may be used to make group membership visually apparent, such as linking lines between parameter widgets and highlighted parameter names as shown, as well as others as may be known in the art.

Embodiments may also allow a user to define variational relationships between linked parameters, so that changes in one parameter cause calculated changes to occur in the others. For example, a user may specify that the product of GATE_WIDTH and GATE_LENGTH should remain at a constant predefined area value. As GATE_WIDTH is increased, GATE_LENGTH would decrease correspondingly. In another embodiment, a single common control widget (not shown) may vary all parameters in a group simultaneously.

Embodiments may perform internal parameter value checking to determine if parameter values are causing consequences that should trigger a user alert and/or modify or halt the Pcell evaluation. For example, if the Pcell evaluation causes a functional error, such as a divide-by-zero error, embodiments may generate a user alert, and the parameter values that caused the error may be highlighted in the display. Similarly, assert statements from the Pcell source code may test any necessary conditions. Any assertion violations that occur may cause the embodiments to generate a user alert and again highlight the parameter values that caused the violation.

Embodiments may further enhance a user's design experience by integrating other design tools into their operation. For example, design rule checkers may be integrated, with their results annotated on the graphical user interface in real time. Design rule violations and the parameter values that triggered them may therefore be made very apparent to the designer. Simulation tools may also be integrated. The designer may adapt designs accordingly for faster design turnaround and increased productivity.

Figure 7:
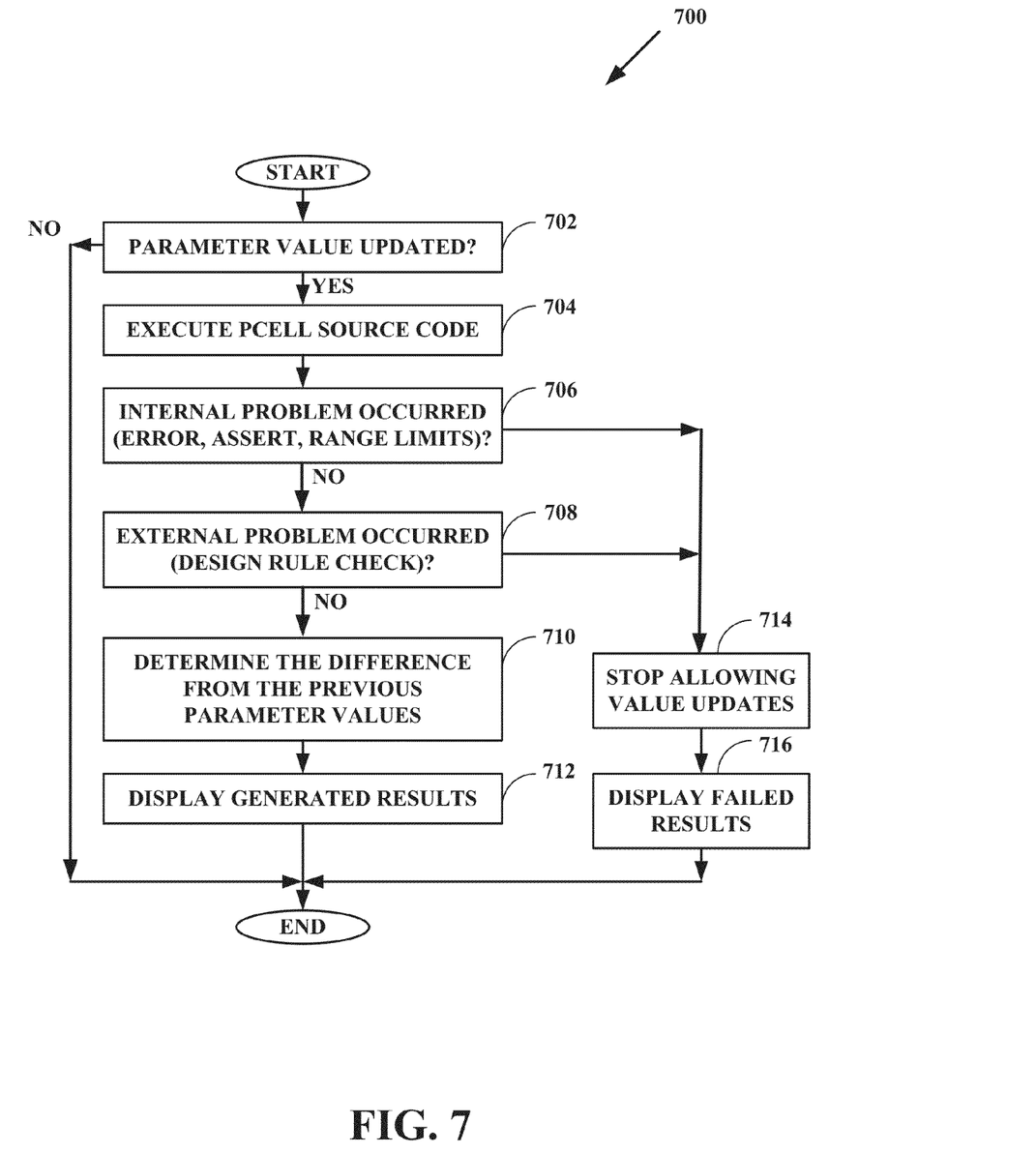
FIG. 7 is a flowchart of a Pcell evaluator operation, according to an embodiment.

FIG. 7 shows a flowchart of Pcell evaluator operation, according to an embodiment. At 702, embodiments may determine if any parameter value has been updated from a previous design iteration. If not, then no action is needed, and the method ends, enabling other aspects of the design process to proceed. If at least one parameter value has been updated, then in 704 the embodiments may execute the Pcell source code using the current parameter values, i.e., including adjustments made in response to user input.

At 706, embodiments may perform internal checks to determine if problems occurred. Such problems may include Pcell evaluation errors such as divide-by-zero errors, violation of assertions in the Pcell source code, and invalid parameter values. If no such problems occurred, the method may proceed to 708, but otherwise may proceed to 714 where user-defined actions for each problem may be undertaken. At 708, embodiments may perform external checks to determine if problem occurred, such as a design rule violation as determined by a design rule checking tool. If not, the method may proceed to 710, but otherwise proceeds to 714 where user-defined actions for each problem may be undertaken.

At 710, embodiments may determine the difference from previous parameter values. The difference may be highlighted via various indicia to help the user to maintain design focus. The embodiments may then display the generated results at 712, using the unified GUI previously described.

At 714, when internal or external problems have occurred, the embodiments may carry out user-defined actions for each identified problem. The user may wish to immediately halt the iterative parameter modification and Pcell evaluation process and receive an alert as soon as any problem event occurs. The user may choose instead to receive warnings, but allow the evaluation process to continue, so that other adjustments may be made. For example, upon hitting a maximum parameter value, the user may wish to adjust the increment value to allow a finer parameter value adjustment within the valid parameter value range. The user may also wish to update other parameters instead of the parameter that triggered the alert.

Figure 8:
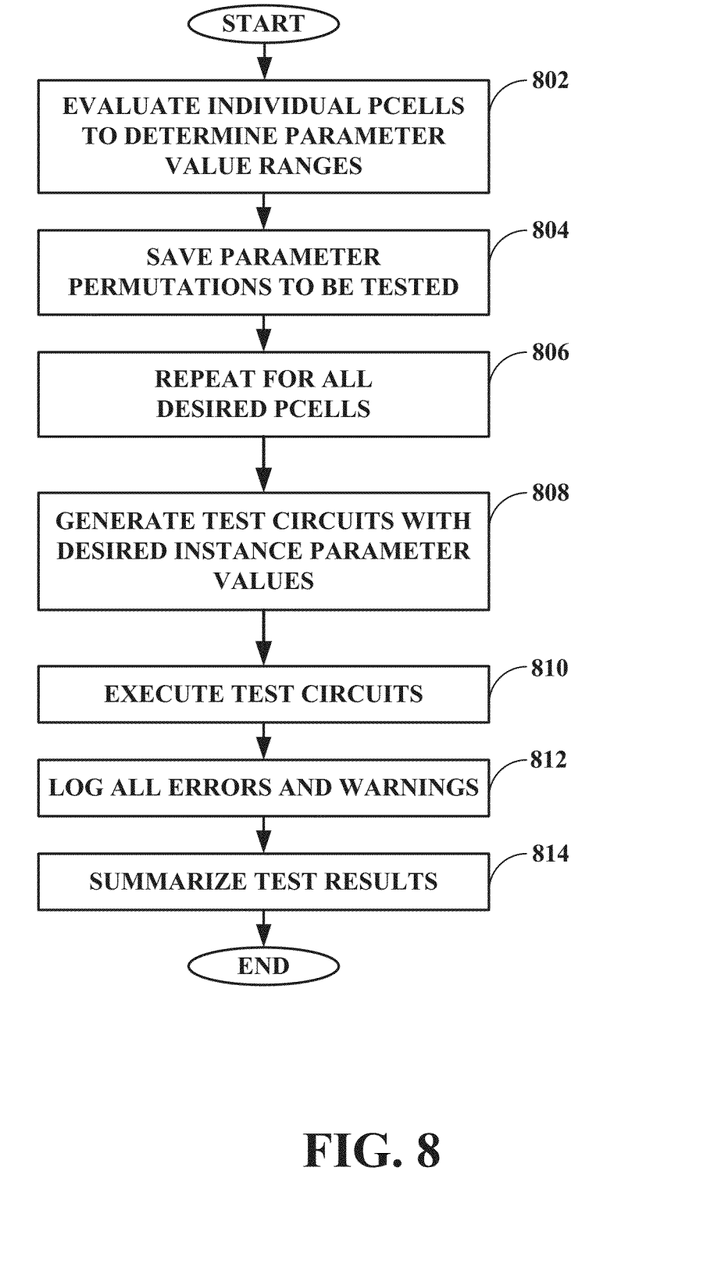
FIG. 8 is a flowchart of a Pcell-based test circuit generation and evaluation method, according to an embodiment.

FIG. 8 shows a flowchart of a Pcell-based test circuit generation and evaluation method, according to an embodiment. This flowchart describes an exemplary use scenario for the embodiments described above. Pcells are often used to generate large numbers of test circuits to be evaluated, with each Pcell provided with a given permutation of input parameter values. As the number of Pcell instances and valid parameter values tested grows in a design, the number of test circuits needed to validate a circuit design can become far too large for easy manual management.

At 802, a user may evaluate individual Pcells to determine acceptable parameter value ranges. A test circuit plan may allow a predetermined number of parameter value permutations for a given Pcell instance. At 804, embodiments save the parameter value permutations to be tested. The parameter value permutation definition and storage aspects of the embodiment may be repeated at 806 for all desired Pcells to be evaluated. Use of master cells and submaster cells to the extent possible may reduce the complexity of the parameter definition and storage.

At 808, embodiments generate test circuits, each with the desired Pcell instance parameter values. Many thousands of test circuits may result, depending on the number of permutations to be evaluated. At 810, embodiments may evaluate the test circuits, calling external tools as needed, and at 812 embodiments may log errors and warnings resulting from test circuit evaluation. At 814, embodiments may summarize test results and provide design guidance for validation.

Figure 9:
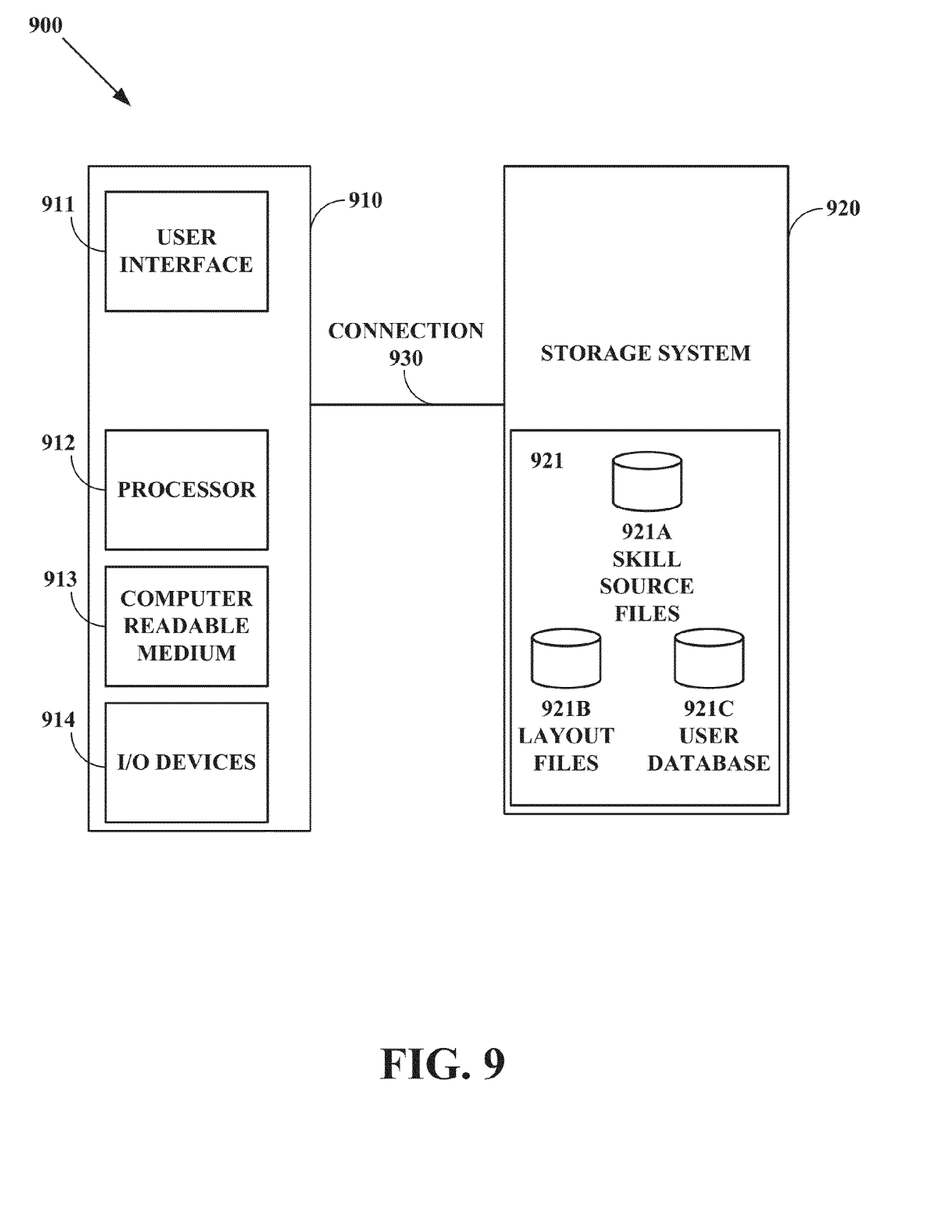
FIG. 9 is a block diagram of a layout analysis system, according to an embodiment.

FIG. 9 shows a block diagram of an exemplary layout analysis system 900, according to an embodiment. This system may provide layout functionality for any of the methods described above. A user may access the system 900 through a standalone client system, client-server environment, or a network environment. System 900 may comprise one or more clients or servers 910, one or more storage systems 920, and a connection or connections 930 between and among these elements.

Client 910 may execute instructions stored on transitory or non-transitory computer readable medium 913 with processor 912, and may provide a user interface 911 to allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a GUI run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media. Databases 921 may be stored in storage system 920 such that they may be persistent, retrieved, or edited by the user. Databases 921 may include SKILL source files 921A, layout files 921B, and a user input database 921C for example. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
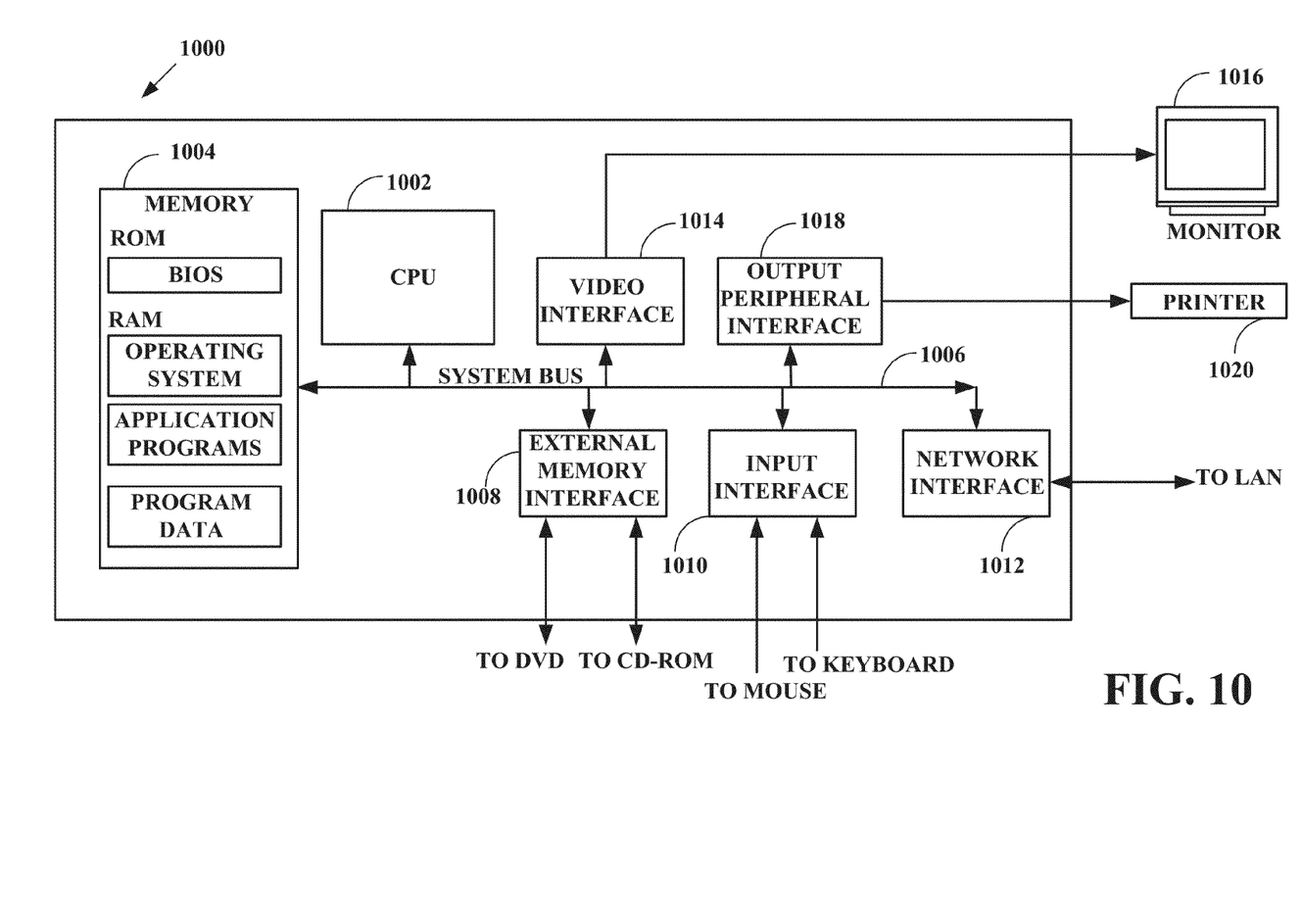
FIG. 10 is a diagram of a computer system, according to an embodiment.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit design tasks, along with software products commercially available for performing computer-aided integrated circuit design tasks. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention will be apparent to ordinarily skilled artisans. The invention is limited only by the scope of the appended claims.

What is claimed is:

1. A method for evaluating a parameterized cell in a circuit design, the method comprising:
   displaying, in a single view in a unified graphical user interface, a parameter and a corresponding parameter value of the parameterized cell;
   continuously adjusting the parameter value according to user input;
   using a computer-operated circuit design tool, evaluating the parameterized cell by executing parameterized cell source code using the adjusted parameter value; and
   tangibly presenting results of the evaluating of the parameterized cell using the adjusted parameter value, in the single view in the unified graphical user interface simultaneously during the displaying, wherein the results comprise at least one of a layout geometry, a modified schematic, and circuit simulation outputs, to facilitate the circuit design.

2. The method of claim 1 wherein the parameter is a variable influencing at least one of a circuit layout, a circuit schematic, and a simulation setting.

3. The method of claim 1 wherein the parameter value further comprises a current value, a minimum value, a maximum value, and an increment value.

4. The method of claim 1 wherein the parameterized cell comprises one of an individual cell instance, a submaster cell, and a master cell.

5. The method of claim 1 wherein the user input is communicated via at least one of a spin box, a slider, a mouse movement, a mouse wheel, an up arrow key, a down arrow key, a trackpad, a touch-sensitive display, and direct keyboard entry.

6. The method of claim 1 wherein the evaluating further comprises:
   integrating validation tools and detecting at least one of design rule check violations, assertion violations, invalid parameter values, and evaluation errors; and
   responsively generating user error alerts and selectively disallowing further adjusting.

7. The method of claim 1 further comprising generating parameterized cell test circuits, each using a parameter value from a permutation of the adjusted parameter values.

8. A non-transitory computer readable medium storing instructions that, when executed by a processor, perform a method for evaluating a parameterized cell in a circuit design, the method comprising:
   displaying, in a single view in a unified graphical user interface, a parameter and a corresponding parameter value of the parameterized cell;
   continuously adjusting the parameter value according to user input;
   using a computer-operated circuit design tool, evaluating the parameterized cell by executing parameterized cell source code using the adjusted parameter value; and
   tangibly presenting results of the evaluating of the parameterized cell using the adjusted parameter value, in the single view in the unified graphical user interface simultaneously during the displaying, wherein the results comprise at least one of a layout geometry, a modified schematic, and circuit simulation outputs, to facilitate the circuit design.

9. The medium of claim 8 wherein the parameter is a variable influencing at least one of a circuit layout, a circuit schematic, and a simulation setting.

10. The medium of claim 8 wherein the parameter value further comprises a current value, a minimum value, a maximum value, and an increment value.

11. The medium of claim 8 wherein the parameterized cell comprises one of an individual cell instance, a submaster cell, and a master cell.

12. The medium of claim 8 wherein the user input is communicated via at least one of a spin box, a slider, a mouse movement, a mouse wheel, an up arrow key, a down arrow key, a trackpad, a touch-sensitive display, and direct keyboard entry.

13. The medium of claim 8 wherein the evaluating further comprises:
   integrating validation tools and detecting at least one of design rule check violations, assertion violations, invalid parameter values, and evaluation errors; and
   responsively generating user error alerts and selectively disallowing further adjusting.

14. The medium of claim 8 further comprising generating parameterized cell test circuits, each using a parameter value from a permutation of the adjusted parameter values.

15. A system comprising:
   a non-transitory memory storing executable instructions; and
   a processor executing the instructions to perform a method for evaluating a parameterized cell, the method comprising:
      displaying, in a single view in a unified graphical user interface, a parameter and a corresponding parameter value of the parameterized cell in a circuit design;
      continuously adjusting the parameter value according to user input;
      using a computer-operated circuit design tool, evaluating the parameterized cell by executing parameterized cell source code using the adjusted parameter value; and
      tangibly presenting results of the evaluating of the parameterized cell using the adjusted parameter value, in the single view in the unified graphical user interface simultaneously during the displaying, wherein the results comprise at least one of a layout geometry, a modified schematic, and circuit simulation outputs, to facilitate the circuit design.

16. The system of claim 15 wherein the parameter is a variable influencing at least one of a circuit layout, a circuit schematic, and a simulation setting.

17. The system of claim 15 wherein the parameter value further comprises a current value, a minimum value, a maximum value, and an increment value.

18. The system of claim 15 wherein the parameterized cell comprises one of an individual cell instance, a submaster cell, and a master cell.

19. The system of claim 15 wherein the user input is communicated via at least one of a spin box, a slider, a mouse movement, a mouse wheel, an up arrow key, a down arrow key, a trackpad, a touch-sensitive display, and direct keyboard entry.

20. The system of claim 15 wherein the evaluating further comprises:
   integrating validation tools and detecting at least one of design rule check violations, assertion violations, invalid parameter values, and evaluation errors; and
   responsively generating user error alerts and selectively disallowing further adjusting.

* * * * *